United States Patent
Liu

(10) Patent No.: US 10,505,551 B2
(45) Date of Patent: *Dec. 10, 2019

(54) GRAY CODE COUNTER

(71) Applicant: TAIWAN SEMICONDUCTOR MANUFACTURING COMPANY LIMITED, Hsin-Chu (TW)

(72) Inventor: Chih-Min Liu, Zhubei (TW)

(73) Assignee: TAIWAN SEMICONDUCTOR MANUFACTURING COMPANY LIMITED, hsin-chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/956,792

(22) Filed: Apr. 19, 2018

(65) Prior Publication Data

US 2018/0241400 A1 Aug. 23, 2018

Related U.S. Application Data

(63) Continuation of application No. 15/483,140, filed on Apr. 10, 2017, now Pat. No. 9,954,536, which is a
(Continued)

(51) Int. Cl.
*H03K 23/00* (2006.01)
*H03L 7/18* (2006.01)
*H03L 7/099* (2006.01)

(52) U.S. Cl.
CPC ........... *H03K 23/005* (2013.01); *H03L 7/099* (2013.01); *H03L 7/18* (2013.01); *H03L 2207/50* (2013.01)

(58) Field of Classification Search
CPC ........... H04L 25/38–4975; H03K 23/004–005; H03L 7/099; H03L 7/06; H03L 2207/50;
(Continued)

(56) References Cited

U.S. PATENT DOCUMENTS 5,428,654 A * 6/1995 Baqai .................. H03K 23/005
377/34
6,229,357 B1 * 5/2001 Nair ....................... H03K 3/037
327/115
(Continued)

FOREIGN PATENT DOCUMENTS

EP 1149472 2/2005

OTHER PUBLICATIONS

August, N., Lee, H., Vandepass, M., and Parker, R. "A TDC-Less ADPLL with 200-to-3299MHz Range and 3mW Power Dissipation for Mobile SoC Clocking in 22nm CMOS," Digest of Technical Papers, 2012 IEEE International Solid-State Circuits Conference, ISSCC 2012/Session 14/Digital Clocking & PLLS/14.4.

*Primary Examiner* — Patrick C Chen
(74) *Attorney, Agent, or Firm* — Cooper Legal Group, LLC

(57) ABSTRACT

One or more gray code counters, counter arrangements, and phase-locked loop (PLL) circuits are provided. A gray code counter comprises a set of cells, such as standard cells, that output a gray code signal. The gray code counter comprises a pre-ready cell that provides an early signal, generated based upon an early clock, to one or more cells to reduce delay. A counter arrangement comprises one or more counter groups configured to provide pixel count levels for pixels, such as pixels of an image sensor array. A counter group comprises a gray code counter configured to provide a gray code signal to latch counter arrangements of the counter group. A PPL circuit comprises a gray code counter configured to generate a gray code signal used by a digital filter to adjust an oscillator. The gray code signal provides n-bit early/late information to the digital filter for adjustment of the oscillator.

20 Claims, 6 Drawing Sheets

Related U.S. Application Data continuation of application No. 14/190,154, filed on Feb. 26, 2014, now Pat. No. 9,621,169.

(58) Field of Classification Search
CPC ....... H03L 7/18; H03L 7/1803; H03L 7/1806; H03L 7/181; H03L 7/183; H03L 7/185; H03L 7/197–199; H03L 7/187; H03L 7/189; H03L 7/191; H03L 7/193; H03L 7/195
USPC .......................................................... 377/34
See application file for complete search history.

(56) References Cited

U.S. PATENT DOCUMENTS

| | | | |
|---|---|---|---|
| 7,092,480 B1* | 8/2006 | Younis | H03K 23/54 327/276 |
| 2003/0108142 A1* | 6/2003 | Hamaguchi | H03K 23/005 377/44 |

* cited by examiner

GRAY CODE COUNTER

RELATED APPLICATION

This application is a continuation of and claims priority to U.S. patent application Ser. No. 15/483,140, titled "GRAY CODE COUNTER" and filed on Apr. 10, 2017, which claims priority to U.S. patent application Ser. No. 14/190,154, titled "GRAY CODE COUNTER" and filed on Feb. 26, 2014. U.S. patent application Ser. Nos. 15/483,140 and 14/190,154 are incorporated herein by reference.

BACKGROUND

Various types of counters are used by circuitry for different purposes such as signal counting. In an example, image sensing circuitry utilizes a plurality of ripple counters that are toggled by a clock. Because the image sensing circuitry uses a relatively large number of ripple counters, such as about 1650 rippled counters, the clock is burdened by a relatively large load and the ripple counters use a relatively large amount of power. In another example, a gray code counter is generated from binary counters. A relatively large number of additional gates are used to transfer from binary code to gray code. Increasing gate count will increase gate delay and area of the gray code counter. The increase in gate delay will degrade operational speed of the gray code counter.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
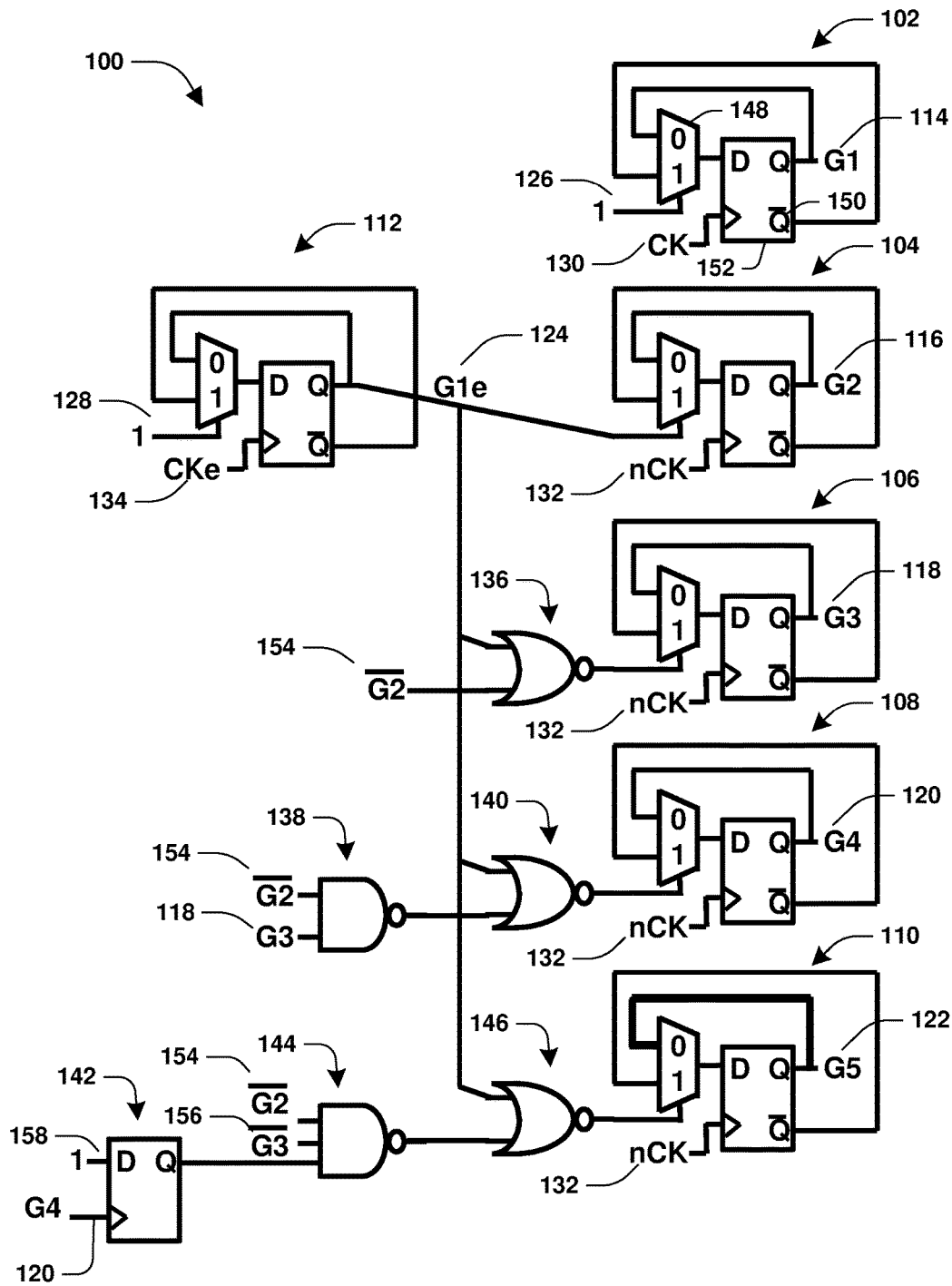
FIG. 1 is an illustration of a gray code counter, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more gray code counters, counter arrangements, and phase-locked loop (PLL) circuits are provided. In some embodiments, a gray code counter comprises a set of cells. In some embodiments, the set of cells comprise standard cells, as opposed to binary counters, which reduces a gate count for the gray code counter. Reducing the gate count will reduce gate delay, and thus improve speed of the gray code counter in comparison with gray code counters that are formed from binary counters. A size of the gray code counter is reduced because of the reduction in gate count. In some embodiments, the gray code counter comprises a pre-ready cell that provides an early signal to one or more cells based upon an early clock signal. Providing the early signal will increase speed of the gray code counter.

In some embodiments, a counter arrangement comprises one or more counter groups. A counter group comprises a gray code counter that provides a gray code signal to a plurality of latch counter arrangements within the counter group. In some embodiments, a single gray code counter provides the gray code signal for the counter group, which reduces a load on a clock that drives the gray code counter and increases a clock rate of the gray code counter such as a clock rate that is double the clock because both rising and falling edges are utilized. In some embodiments, the counter arrangement is used for image sensing circuitry. The counter arrangement has relatively less error from latching at edges, in comparison with image sensing circuitry that use binary counters such as ripple counters, because latching occurs at fewer edges of the gray code signal, such as a single edge of a 5-bit gray code signal.

In some embodiments, a phase-locked loop (PLL) circuit comprises a gray code counter configured to generate a gray code signal based upon an oscillator frequency output by an oscillator. A latch is configured to latch the gray code signal based upon a reference signal to create a latched gray code signal. In some embodiments, the latched gray code signal provides N-bit early/later information corresponding to a frequency difference between the oscillator frequency and a reference frequency of the reference signal. Because N-bits of early/late information is provided, the frequency difference is known in a single iteration. In this way, a digital filter can adjust the oscillator based upon the latched gray code signal.

FIG. 1 illustrates a gray code counter 100. The gray code counter 100 comprises a set of cells, such as a first cell 102, a second cell 104, a third cell 106, a fourth cell 108, a fifth cell 110, or other cells. In some embodiments, the set of cells comprise standard cells, which provide for a relatively simpler realization of the gray code counter 100 in comparison with building a gray code counter with binary counters. The set of cells are configured to output a gray code signal, such as a five-bit gray code signal where the set of cells comprises the first cell 102, the second cell 104, the third cell 106, the fourth cell 108, and the fifth cell 110.

The first bit cell 102 is configured to output a first gray code signal portion 114 of the gray code signal based upon a clock signal 130 and a high signal 126. In some embodiments, the high signal 126, such as a "1", is inputted into a MUXselect of a MUX 148, such that the MUX 148 will select a signal $\bar{Q}$ 150 of a flip flop 152 that is connected to a DATA1 input of the MUX 148. The signal $\bar{Q}$ 150 corresponds to an inverse of a signal Q of the flip flop 152. The signal Q is outputted as the first gray code signal portion 114. When a rising edge of the clock signal 130 is detected by the flip flop 152, the signal $\bar{Q}$ 150 is latched such that the signal Q has a value of the signal $\bar{Q}$ 150, which is an inversion of the prior value of signal Q. In this way, the first cell 102 toggles between outputting the first gray code signal portion 114 as either a "0" or a "1." In some embodiment, a first toggle condition for the first gray code signal portion 114 is the rising edge of the clock signal 130.

The gray code counter 100 comprises a pre-ready cell 112 configured to generate an early first signal 124 based upon a high signal 128 and an early clock signal 134. The early first signal 124 corresponds to the first gray code signal portion 114 outputted by the first cell 102. The early first signal 124 is provided to the second cell 104 and one or more logic arrangements associated with the set cells, such as a first logic arrangement 136 associated with the third cell 106, a second logic arrangement 140 associated with the fourth cell 108, and a third logic arrangement 146 associated with the fifth cell 110. Performance, such as speed of the gray code counter 100, is improved because the second cell 104 and the one or more logic arrangements are not delayed from waiting on the first cell 102 to output the first gray code signal portion 114, but instead can use the early first signal 124 generated based upon the early clock signal 134.

The second bit cell 104 is configured to output a second gray code signal portion 116 based upon a next clock signal 132 and the early first signal 124 provided by the pre-ready cell 112. In this way, the second bit cell 104 will toggle the second gray code signal portion 116 based upon the early first signal 124 and the next clock signal 132. In some embodiments, a second toggle condition of the second gray code signal portion 116 corresponds to a rising edge of the next clock signal 132 and a high state of the early first signal 124, such that a second signal $\bar{Q}$ is latched, based upon the high state of the early first signal 124, so that a value of a second signal Q transitions to a value of the second signal $\bar{Q}$.

The third bit cell 106 is configured to output a third gray code signal portion 118 based upon the next clock signal 132 and a first logical output from the first logic arrangement 136. In some embodiments, the first logic arrangement 136 comprises a NOR gate, and the first logical output corresponds to a NOR operation of the early first signal 124 and an inverted second gray code signal portion 154 that is an inversion of the second gray code signal portion 116. In this way, the third bit cell 106 will toggle the third gray code signal portion 118 based upon the next clock signal 132 and the first logical output from the first logic arrangement 136. In some embodiments, a third toggle condition of the third gray code signal portion 118 corresponds to a rising edge of the next clock signal 132, a low state of the inverted second gray code signal portion 154, and a low state of the early first signal 124 such that a third signal $\bar{Q}$ is latched, based upon the NOR gate outputting a 1 to a third MUX, so that a value of a third signal Q transitions to a value of the third signal $\bar{Q}$.

The fourth bit cell 108 is configured to output a fourth gray code signal portion 120 based upon the next clock signal 132 and a second logical output from the second logic arrangement 140. In some embodiments, the second logic arrangement 140 comprises a NOR gate, and the second logical output corresponds to a NOR operation of the early first signal 124 and a fourth logical output from a fourth logic arrangement 138. The fourth logical output of the fourth logic arrangement 138 corresponds to a NAND operation of the inverted second gray code signal portion 154 and the third gray code signal portion 118. In this way, the fourth bit cell 108 toggles the fourth gray code signal portion 120 based upon the next clock signal 132 and the second logical output from the second logic arrangement 140. In some embodiments, a fourth toggle condition of the fourth gray code signal portion 120 corresponds to a rising edge of the next clock signal 132, a high state of the third gray code signal portion 118, a high state of the inverted second gray code signal portion 154, and a low state of the early first signal 124 such that a fourth signal $\bar{Q}$ is latched, based upon the NOR gate outputting a 1 to a fourth MUX, so that a value of a fourth signal Q transitions to a value of the fourth signal $\bar{Q}$.

The fifth bit cell 110 is configured to output a fifth gray code signal portion 122 based upon the next clock signal 132 and a third logical output from the third logic arrangement 146. In some embodiments, the third logic arrangement 146 comprises a NOR gate, and the third logic output corresponds to a NOR operation of the early first signal 124 and a fifth logical output from a fifth logic arrangement 144. The fifth logical output of the fifth logic arrangement 144 corresponds to a NAND operation of the inverted second gray code signal portion 154, an inverted third gray code signal portion 156 that is inversion of the third gray code signal portion 118, and a static control signal from a static control signal component 142. The static control signal component 142 outputs the static control signal based upon a second high signal 158 and the fourth gray code signal portion 120. In this way, the fifth bit cell 110 toggles the fifth gray code signal portion 122 based upon the next clock signal 132 and the third logical output from the third logic arrangement 146. In some embodiments, a fifth toggle condition of the fifth gray code signal portion 122 corresponds to a rising edge of the next clock signal 132, a high state of the inverted second gray code signal portion 154, a high state of the inverted third gray code signal portion 156, and a low state of the early first signal 124 such that a fifth signal $\bar{Q}$ is latched, based upon the NOR gate outputting a 1 to a fifth MUX, so that a value of a fifth signal Q transitions to a value of the fifth signal $\bar{Q}$.

In some embodiments, rising edges and falling edges are used to double the count rate of the gray code counter 100, such that the count rate is about double the clock rate. In some embodiments, the count rate is between about 3 GHz to about 3.8 GHz, such as 3.4 GHz that is double a 1.7 GHz cock rate. In some embodiments, the set of cells comprise standard cells, as opposed to binary counters, which reduces a gate count of the gray code counter 100. Reducing the gate count results in a reduced gate delay for improved speed and a decreased area for the gray code counter 100. Utilizing standard cells, as opposed to binary counters, decreases a complexity of the gray code counter 100. Providing the early first signal 124, corresponding to the first gray code signal portion 114, based upon the early clock signal 134 reduces delay that would otherwise result from waiting on the first gray code signal portion 114 generated based upon the clock signal 130. In some embodiments, the gray code counter 100, such as a 5-bit gray code counter, comprises between about 134 PMOS transistors to about 154 PMOS transistors, such as about 144 PMOS transistors. In some embodiments, the gray code counter 100, such as the 5-bit gray code counter, comprises between about 134 NMOS transistors to about 154 NMOS transistors, such as about 144 NMOS transistors. In this way, the gray code counter 100 has a MOS reduction between about 18.4% to about 28.4%, such as about 23.4%.

Figure 2:
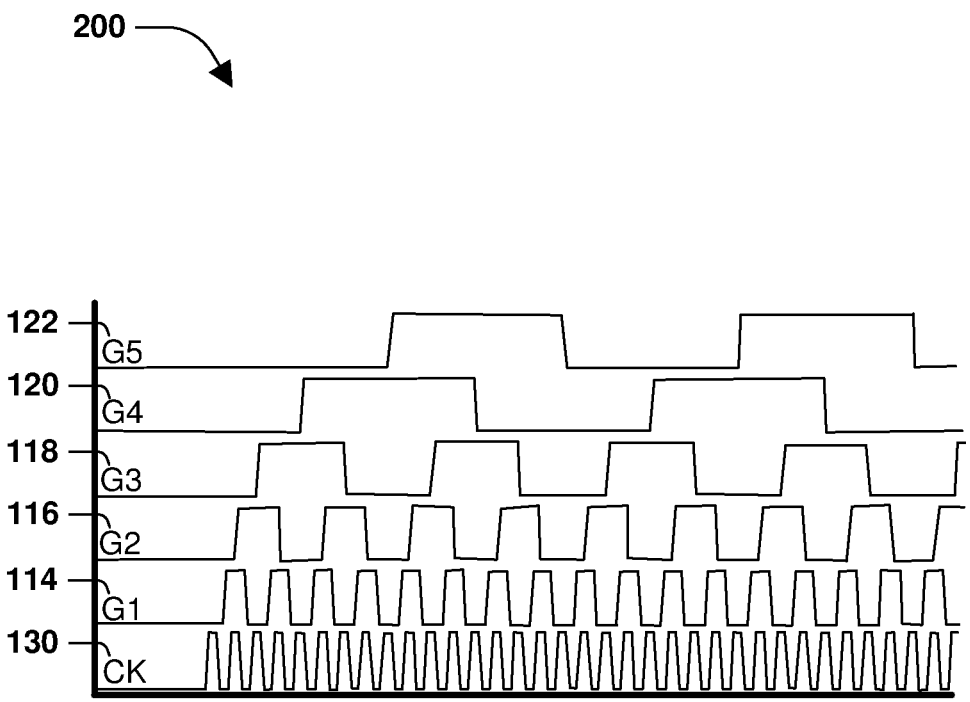
FIG. 2 is an illustration of a timing diagram for a gray code counter, in accordance with some embodiments.

FIG. 2 illustrates a timing diagram 200 for the gray code counter 100. The first gray code signal portion 114 toggles based upon a falling edge of the clock signal 130. The second gray code signal portion 116 toggles based upon the first gray code signal portion 114 being high and a rising edge of the clock signal 130. The third gray code signal portion 118 toggles based upon the second gray code signal being high, the first gray code signal being low, and a rising edge of the clock signal 130. The fourth gray code signal portion 120 toggles based upon the third gray code signal portion 118 being high, the second gray code signal portion 116 being low, the first gray code signal portion 114 being low, and a rising edge of the clock signal 130. The fifth gray code signal portion 122 corresponds to a shift of the fourth gray code signal portion 120, such that the fifth gray code signal portion 122 has the same frequency of the fourth gray code signal portion 120 and the fourth gray code signal portion 120 occurs earlier than the fifth gray code signal portion 122.

Figure 3A:
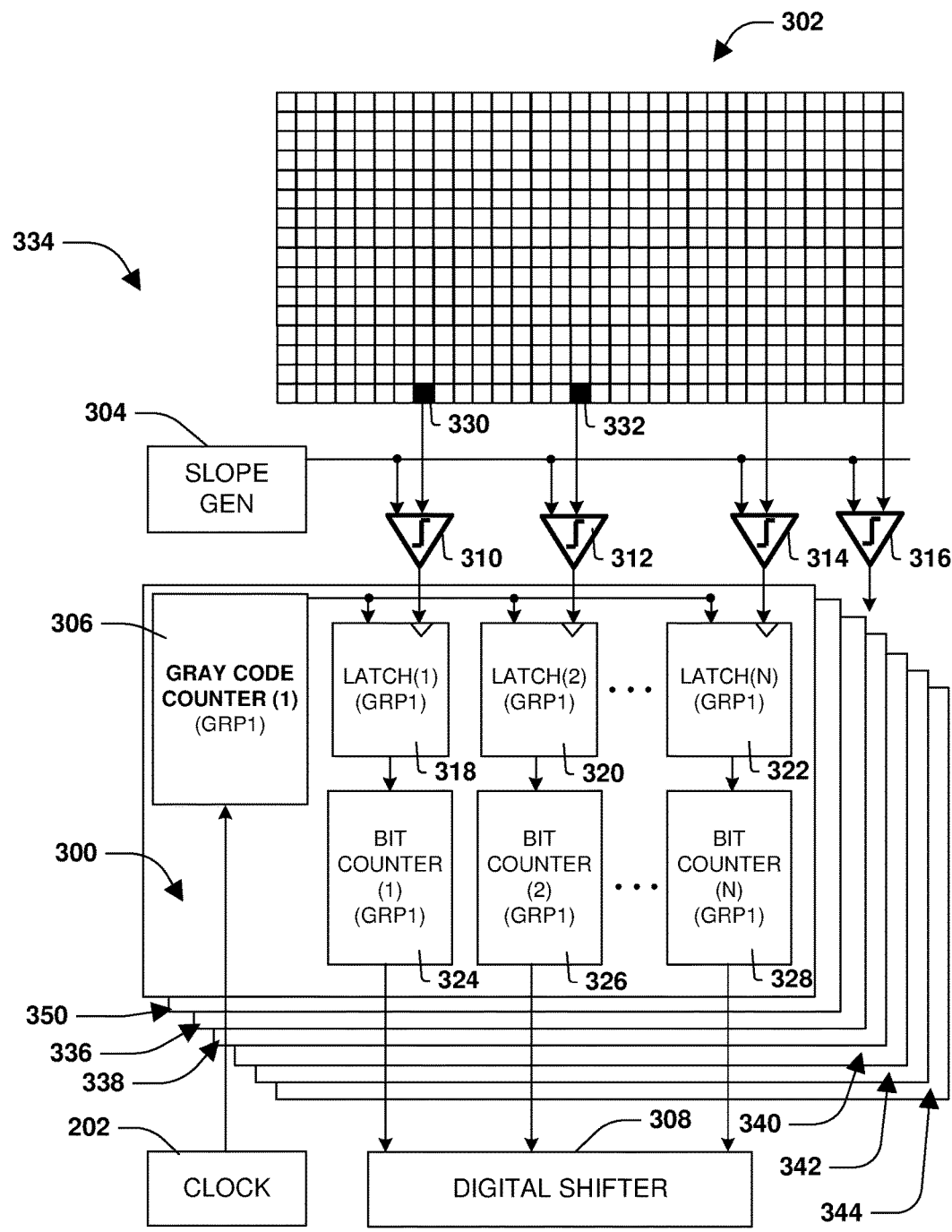
FIG. 3A is an illustration of a first counter group of a counter arrangement, in accordance with some embodiments.
Figure 3B:
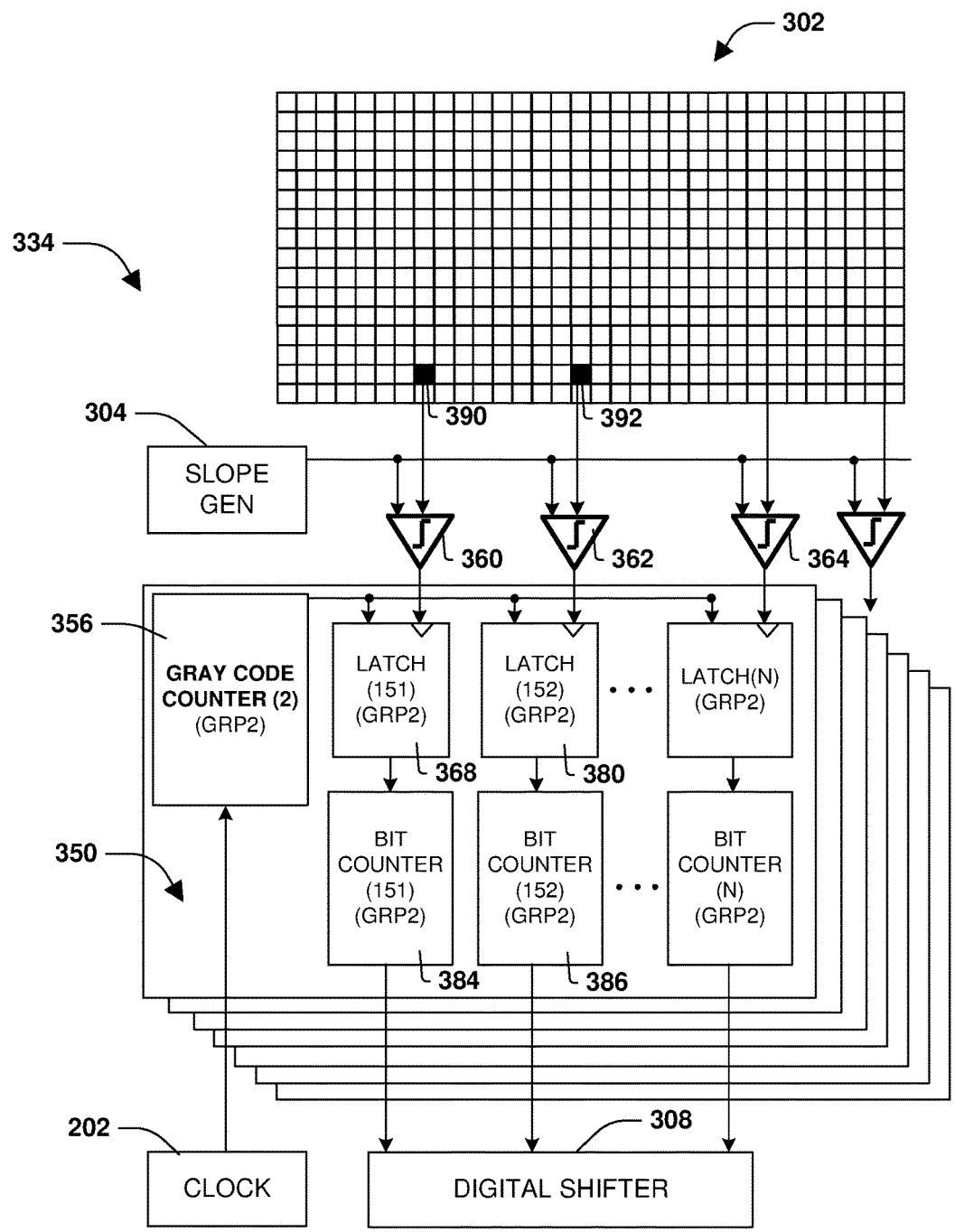
FIG. 3B is an illustration of a second counter group of a counter arrangement, in accordance with some embodiments.

FIGS. 3A and 3B illustrate a counter arrangement 334. The counter arrangement 334 comprises a set of comparators, such as a first comparator 310, a second comparator 312, a third comparator 314, a fourth comparator 316, or other comparators not illustrated. The set of comparators are configured to provide a set of pixel detection signals to one or more counter groups. A pixel detection signal corresponds to a pixel value of a pixel that matches a comparator value from a slope generator 304. In some embodiments, the counter arrangement 334 comprises a stacked arrangement or any other arrangement of a first counter group 300, a second counter group 350, a third counter group 336, a fourth counter group 338, a fifth counter group 340, a sixth counter group 342, a seventh counter group 344, or other counter groups not illustrated, such as 11 total counter groups. In some embodiments, a counter group comprises a gray code counter that operates based upon a clock signal from a clock generator 202, such as a first gray code counter 306 comprised within the first counter group 300. In some embodiments, a counter group comprises a single gray code counter, which reduces a load on the clock generator 202. In some embodiments, the clock generator 202 has a load corresponding to a number of gray code counters. In some embodiments, the number of gray code counters corresponds to a number of counter groups where single gray code counters are used by respective counter groups.

In some embodiments, the counter arrangement 334 is associated with an image sensor array 302 of image sensing circuitry. The counter arrangement 334 comprises a plurality of connections that connect the set of comparators to a plurality of pixels of the image sensor array 302 such that comparators of the set of comparators receive pixels values from the plurality of pixels. In some embodiments, the first comparator 310 receives a first pixel value from a first pixel 330. The first comparator 310 compares the first pixel value with a first comparison value provided by the slope generator 304 that is configured to provide comparison values to the set of comparators for comparison with pixel values. Responsive to a match, the first comparator 310 provides a first pixel detection signal to a first latch 318 of a first latch counter arrangement comprising the first latch 318 and a first bit counter 324. The first gray code counter 306 is configured to output a first gray code signal to a first set of latch counter arrangements, such as the first latch counter arrangement comprising the first latch 318 and the first bit counter 324. The first latch 318 is configured to provide a first latched value to the first bit counter 324 based upon the first gray code signal and the first pixel detection signal associated with the first pixel 330. The first bit counter 324 is configured to provide a first pixel count level for the first pixel 330, such as to a digital shifter 308. In some embodiments, the first counter group 300 comprises the first set of latch counter arrangements, such as the first latch count arrangement comprising the first latch 318 and the first bit counter 324, a second latch counter arrangement comprising a second latch 320 and a second bit counter 326, or other latch counter arrangements such as a nth latch counter arrangement comprising an nth latch 322 and an nth bit counter 328. In some embodiments, the first counter group 300 comprises between about 140 to about 160 latch counter arrangements, such as about 150 latch counter arrangements.

In some embodiments, the second comparator 312 receives a second pixel value from a second pixel 332. The second comparator 312 compares the second pixel value with a second comparison value provided by the slope generator 304. Responsive to a match, the second comparator 312 provides a second pixel detection signal to the second latch 320 of the second latch counter arrangement that comprises the second latch 320 and the second bit counter 326. The first gray code counter 306 provides the first gray code signal to the second latch count arrangement comprising the second latch 320 and the second bit counter 326. The second latch 320 is configured to provide a second latched value to the second bit counter 326 based upon the first gray code signal and the second pixel detection signal associated with the second pixel 332. The second bit counter 326 is configured to provide a second pixel count level for the second pixel 332, such as to the digital shifter 308.

Figure 3C:
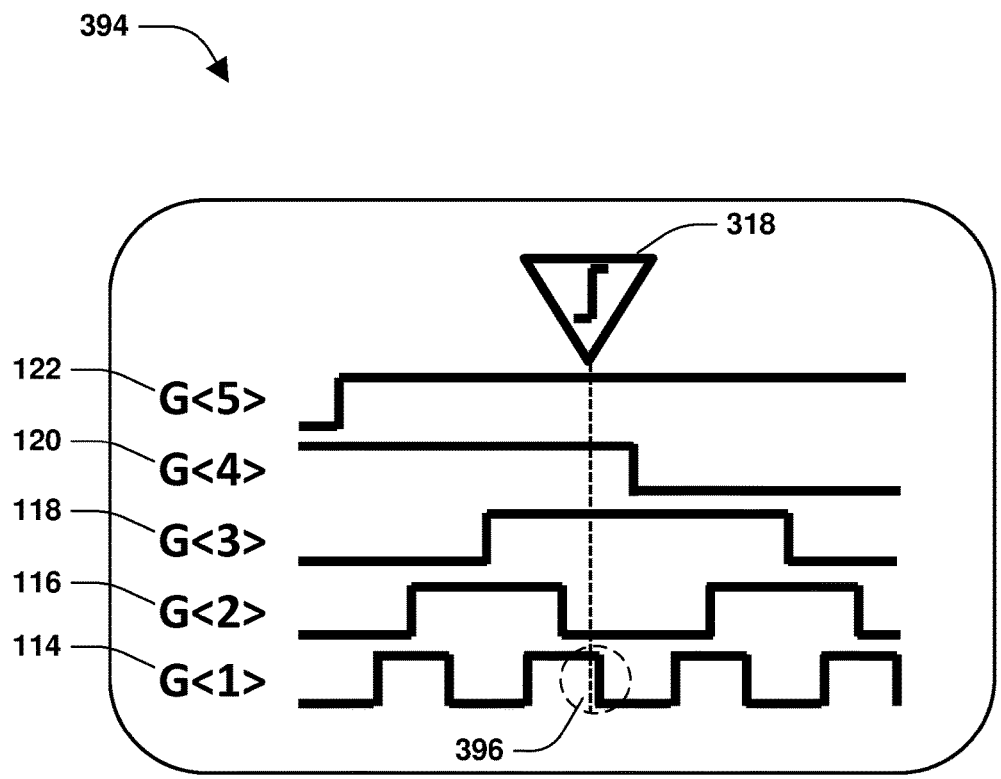
FIG. 3C is an illustration of a timing diagram for a gray code counter, in accordance with some embodiments.

FIG. 3B illustrates the second counter group 350 of the counter arrangement 334. The second counter group 350 comprises a second gray code counter 356 configured to output a second gray code signal to a second set of latch counter arrangements. In some embodiments, the second set of latch counter arrangements comprises a latch counter arrangement (151) comprising a latch (151) 368 and a bit counter (151) 384, a latch counter arrangement (152) comprising a latch (152) 380 and a bit counter 386 (152), or other latch counter arrangements not illustrated, such as a total of 150 latch counter arrangements. The set of comparators comprises a comparator 360 for a pixel 390, a comparator 362 for a pixel 392, a comparator 364, or other comparators that provide pixel detection signals to the second set of latch counter arrangements. In this way, the counter arrangement 334 comprises one or more counter groups, such as in a stacked arrangement or any other arrangement. Because the counter arrangement 334 comprises a relatively smaller number of gray code counters, such as a single gray code counter per counter group, the load on the clock generator 202 is reduced. Latching errors from latching at edge transitions of the set of comparators is reduced, as illustrated by timing diagram 394 of FIG. 3C. In some embodiments, the first comparator 318 latches at an edge 396 of the first gray code signal portion 114, and at non-edge portions of the second gray code signal portion 116, the third gray code signal portion 118, the fourth gray code signal portion 120, the fifth gray code signal portion 122, etc.

Figure 4:
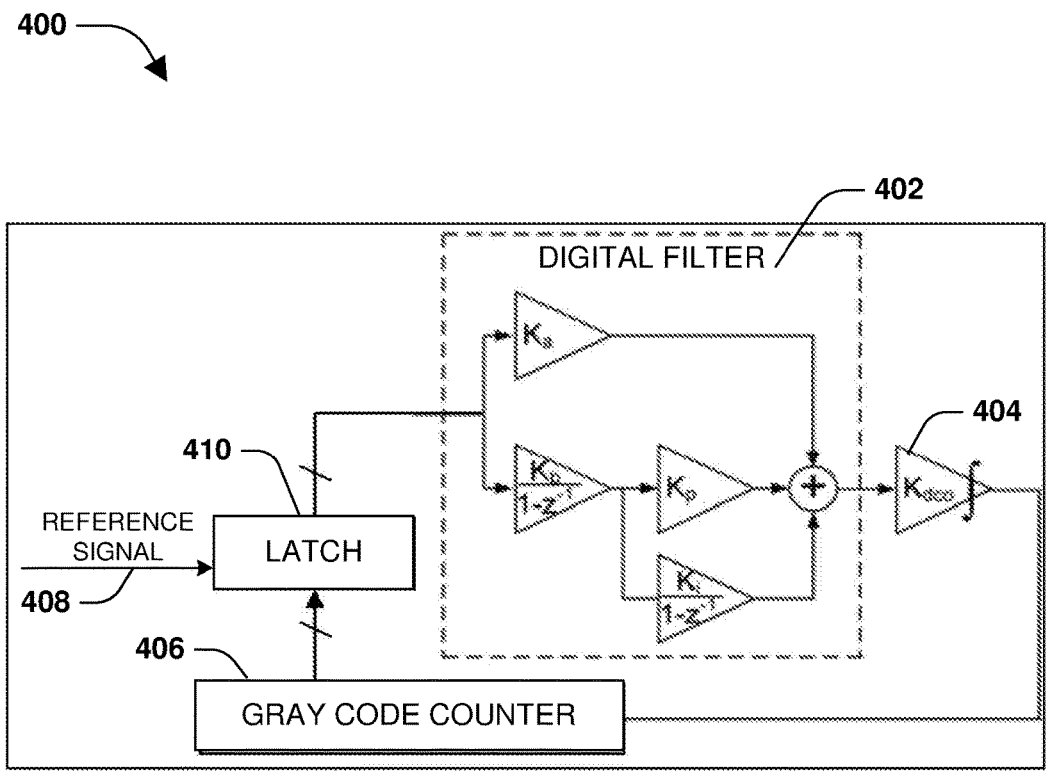
FIG. 4 is an illustration of a phase-locked loop circuit, in accordance with some embodiments.

FIG. 4 illustrates a phase-locked loop (PLL) circuit 400. The PLL circuit 400 comprises a gray code counter 406, a latch 410, and a digital filter 402. The gray code counter 406 is configured to generate a gray code signal based upon an oscillator frequency output by an oscillator 404. In some embodiments, the gray code counter 406 comprises the gray code counter 100 of FIG. 1 or a modification thereof. The latch 410 is configured to latch the gray code signal based upon a reference signal 408 to create a latched gray code signal. In some embodiments, the latched gray code signal comprises multi-bit early information for the oscillator frequency, and the multi-bit early information corresponds to a frequency difference between the oscillator frequency and a reference frequency of the reference signal 408. In some embodiments, the latched gray code signal comprises multi-bit late information for the oscillator frequency, and the multi-bit late information corresponds to a frequency difference between the oscillator frequency and the reference frequency of the reference signal 408.

The digital filter 402 is configured to adjust the oscillator 404 based upon the latched gray code signal. In some embodiments, the digital filter 402 adjusts the oscillator 404 to output an adjusted oscillator frequency output corresponding to the reference frequency of the reference signal 408 based upon the latched gray code signal. In some embodiments, because the latched gray code signal provides multi-bit early/late information, the digital filter 402 adjusts the oscillator 404 to output the adjusted oscillator frequency output corresponding to the reference frequency in a single iteration of the gray code counter 406.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Further, unless specified otherwise, "first," "second," and/or the like are not intended to imply a temporal aspect, a spatial aspect, an ordering, etc. Rather, such terms are merely used as identifiers, names, etc. for features, elements, items, etc. For example, a first object and a second object generally correspond to object A and object B or two different or two identical objects or the same object.

Moreover, "exemplary" is used herein to mean serving as an example, instance, illustration, etc., and not necessarily as advantageous. As used herein, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

According to an aspect of the instant disclosure, a gray code counter is provided. The gray code counter comprises a set of cells configured to output a gray code signal. The set of cells comprises a first cell configured to output a first gray code signal portion of the gray code signal based upon a clock signal and a high signal. The set of cells comprises a second cell configured to output a second gray code signal portion of the gray code signal based upon a next clock signal and an early first signal provided by a pre-ready cell. The gray code counter comprises the pre-ready cell that is configured to provide the early first signal to the second cell. The early first signal corresponds to the first gray code signal portion output by the first cell. The pre-ready cell is configured to operate based upon an early clock signal.

According to an aspect of the instant disclosure, a counter arrangement is provided. The counter arrangement comprises a set of comparators configured to provide a set of pixel detection signals to one or more counter groups. The counter arrangement comprises a first counter group of the one or more counter groups. The first counter group comprises a first gray code counter configured to output a first gray code signal to a first set of latch counter arrangements. A first latch counter arrangement, of the first set of latch counter arrangements, comprises a first latch. The first latch is configured to provide a first latched value to a first bit counter based upon the first gray code signal and a first pixel detection signal of the set of pixel detection signals. The first pixel detection signal is associated with a first pixel. The bit counter is configured to provide a first pixel count level for the first pixel.

According to an aspect of the instant disclosure, a phase-locked loop (PLL) circuit is provided. The PLL circuit comprises a gray code counter configured to generate a gray code signal based upon an oscillator frequency output by an oscillator. The PLL circuit comprises a latch configured to latch the gray code signal based upon a reference signal to create a latched gray code signal. The PLL circuit comprises a digital filter configured to adjust the oscillator based upon the latched gray code signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A gray code counter, comprising:
a pre-ready cell comprising a first multiplexer and a first flip flop, wherein:
the first multiplexer is coupled to an input of the first flip flop, and
the pre-ready cell is configured to generate an early first signal based upon a first clock signal received by the first flip flop and a first select signal received by the first multiplexer;
a first cell configured to generate a first gray code signal portion of a gray code signal, corresponding to the early first signal, based upon a second clock signal and a second select signal received by the first cell; and
a second cell comprising a second multiplexer having a first select input coupled to the pre-ready cell, wherein:
the early first signal is provided from the pre-ready cell to the first select input of the second multiplexer in the second cell, and
the second cell is configured to generate a second gray code signal portion of the gray code signal based upon a third clock signal and the early first signal, wherein the third clock signal is different than the first clock signal and the second clock signal.

2. The gray code counter of claim 1, wherein:
the second cell comprises a second flip flop,
the second gray code signal portion of the gray code signal is output from the second cell at a first output of the second flip flop, and
a first input of the second multiplexer is coupled to the first output of the second flip flop and receives the second gray code signal portion of the gray code signal.

3. The gray code counter of claim 2, wherein:
the second flip flop comprises a second output, and
a second input of the second multiplexer is coupled to the second output of the second flip flop.

4. The gray code counter of claim 2, wherein:
an output of the second multiplexer is coupled to a first input of the second flip flop, and
the third clock signal is applied to a second input of the second flip flop.

5. The gray code counter of claim 1, comprising:
a first logic gate comprising a first input coupled to the pre-ready cell, wherein the early first signal is provided from the pre-ready cell to the first input of the first logic gate.

6. The gray code counter of claim 5, comprising:
a third cell comprising a third multiplexer having a second select input coupled to an output of the first logic gate.

7. The gray code counter of claim 6, wherein the third cell is configured to generate a third gray code signal portion of the gray code signal based upon the third clock signal.

8. The gray code counter of claim 5, wherein:
the first select input of the second multiplexer in the second cell and the first input of the first logic gate are commonly coupled to an output of the first flip flop.

9. The gray code counter of claim 5, wherein:
the first select input of the second multiplexer in the second cell, the first input of the first logic gate, and an output of the first flip flop are commonly coupled to a first input of the first multiplexer.

10. The gray code counter of claim 5, comprising:
a second logic gate comprising a first input coupled to the pre-ready cell, wherein the early first signal is provided from the pre-ready cell to the first input of the second logic gate.

11. The gray code counter of claim 10, comprising:
a third cell comprising a third multiplexer having a second select input coupled to an output of the first logic gate; and
a fourth cell comprising a fourth multiplexer having a third select input coupled to an output of the second logic gate.

12. The gray code counter of claim 1, wherein the early first signal is applied to an input of the first multiplexer.

13. A gray code counter, comprising:
a pre-ready cell configured to generate an early first signal based upon a first clock signal and a first select signal received by the pre-ready cell;
a first cell coupled to the pre-ready cell and configured to generate a first gray code signal portion of a gray code signal based upon a second clock signal and the early first signal received by the first cell; and
a first logic gate having a first input coupled to the pre-ready cell and configured to receive the early first signal and a second input configured to receive an inversion of the first gray code signal portion of the gray code signal, wherein the first logic gate is a two-input logic gate.

14. The gray code counter of claim 13, wherein:
the first cell comprises a multiplexer having a select input, and
the select input of the multiplexer and the first input of the first logic gate are commonly coupled to an output of the pre-ready cell.

15. The gray code counter of claim 13, wherein:
the pre-ready cell comprises a first multiplexer and a flip flop,
the first cell comprises a second multiplexer having a select input, and
the select input of the second multiplexer, the first input of the first logic gate, and an output of the flip flop are commonly coupled to an input of the first multiplexer.

16. The gray code counter of claim 13, comprising:
a second cell coupled to an output of the first logic gate and configured to generate a second gray code signal portion of the gray code signal based upon a third clock signal and a signal output from the first logic gate.

17. The gray code counter of claim 16, wherein the second cell comprises a multiplexer and the output of the first logic gate is coupled to a select input of the multiplexer.

18. A gray code counter, comprising:
a pre-ready cell configured to generate an early first signal based upon a first clock signal and a first select signal received by the pre-ready cell;
a first cell configured to generate a first gray code signal portion of a gray code signal, corresponding to the early first signal, based upon a second clock signal and a second select signal received by the first cell;
a logic gate having a first input coupled to the pre-ready cell and configured to receive the early first signal and a second input coupled to the first cell and configured to receive an inversion of the first gray code signal portion of the gray code signal; and
a second cell coupled to an output of the logic gate and configured to generate a second gray code signal portion of the gray code signal based upon a third clock signal and a signal output at the output of the logic gate, wherein the second cell comprises a multiplexer and the output of the logic gate is coupled to a select input of the multiplexer.

19. The gray code counter of claim 18, wherein the second cell comprises a flip flop and an output of the flip flop, at which the second gray code signal portion of the gray code signal is output, is coupled to a second input of the multiplexer.

20. The gray code counter of claim 18, wherein the logic gate is a two-input logic gate.

* * * * *